US008837146B2

(12) United States Patent
Wang

(10) Patent No.: US 8,837,146 B2
(45) Date of Patent: Sep. 16, 2014

(54) FOLDABLE ELECTRONIC DEVICE

(75) Inventor: Yuan-Ming Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/600,212

(22) Filed: Aug. 30, 2012

(65) Prior Publication Data

US 2013/0314853 A1 Nov. 28, 2013

(30) Foreign Application Priority Data

May 25, 2012 (CN) .......................... 2012 1 0165757

(51) Int. Cl.
*G06F 1/16* (2006.01)
*H05K 5/00* (2006.01)
(52) U.S. Cl.
USPC .................................................... 361/679.58
(58) Field of Classification Search
USPC .............. 361/679.02, 679.27, 679.55, 679.58
See application file for complete search history.

(56) References Cited

U.S. PATENT DOCUMENTS

| 6,937,465 | B2* | 8/2005 | Park ........................ 361/679.08 |
| 7,813,125 | B2* | 10/2010 | Huang ..................... 361/679.58 |
| 7,986,518 | B2* | 7/2011 | Wang et al. ............. 361/679.33 |
| 8,109,541 | B2* | 2/2012 | Chang et al. .................... 292/95 |
| 2003/0142472 | A1* | 7/2003 | Park .............................. 361/683 |
| 2005/0152120 | A1* | 7/2005 | Lee ................................ 361/725 |
| 2009/0129008 | A1* | 5/2009 | Wang et al. ............. 361/679.33 |
| 2010/0008041 | A1* | 1/2010 | Wang ....................... 361/679.58 |

* cited by examiner

*Primary Examiner* — Adrian S Wilson
(74) *Attorney, Agent, or Firm* — Novak Druce Connolly Bove + Quigg LLP

(57) ABSTRACT

A foldable electronic device includes a main body defining a through hole. A cover is rotatably connected to the main body and includes a hook corresponding to the through hole. A slidable member is slidably connected to the main body, and includes hook receiver and a wedged portion. The hook receiver includes an engaging projection that is able to engage with the hook that passes through the through hole, thereby locking the cover on the main body. A button is movably connected to the main body, and includes a protruding tab to push the wedged portion to cause the slidable member to move, thereby allowing the hook to disengage from the engaging projection.

5 Claims, 6 Drawing Sheets

FOLDABLE ELECTRONIC DEVICE

BACKGROUND

1. Technical Field

The present disclosure relates to a foldable electronic device.

2. Description of Related Art

Many foldable electronic devices include a main body and a cover that is rotatably connected to the main body, such as notebook computers. In some of the foldable electronic devices, there is a need to lock the cover to the main body. Although conventional connection mechanisms can meet the need, it is still desirable and useful to provide a foldable electronic device with a new connection mechanism for locking the cover to the main body.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will be described with reference to the accompanying drawings.

Figure 1:
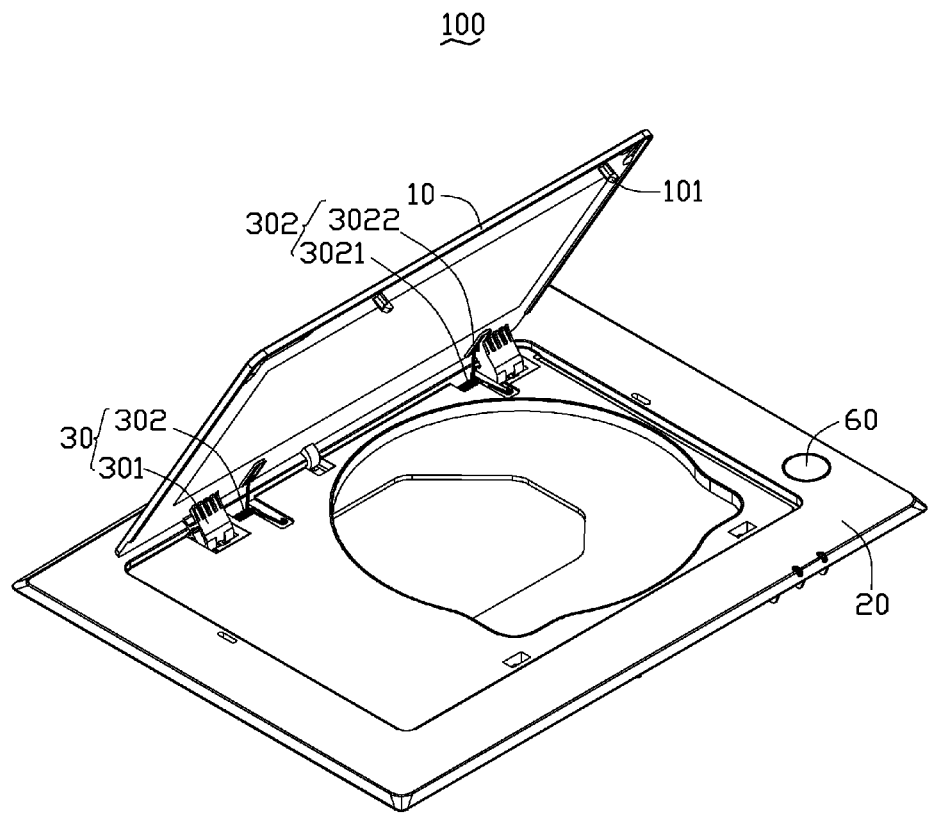
FIG. 1 is an isometric view of a foldable electronic device, with a cover opened, in accordance with an exemplary embodiment.
Figure 2:
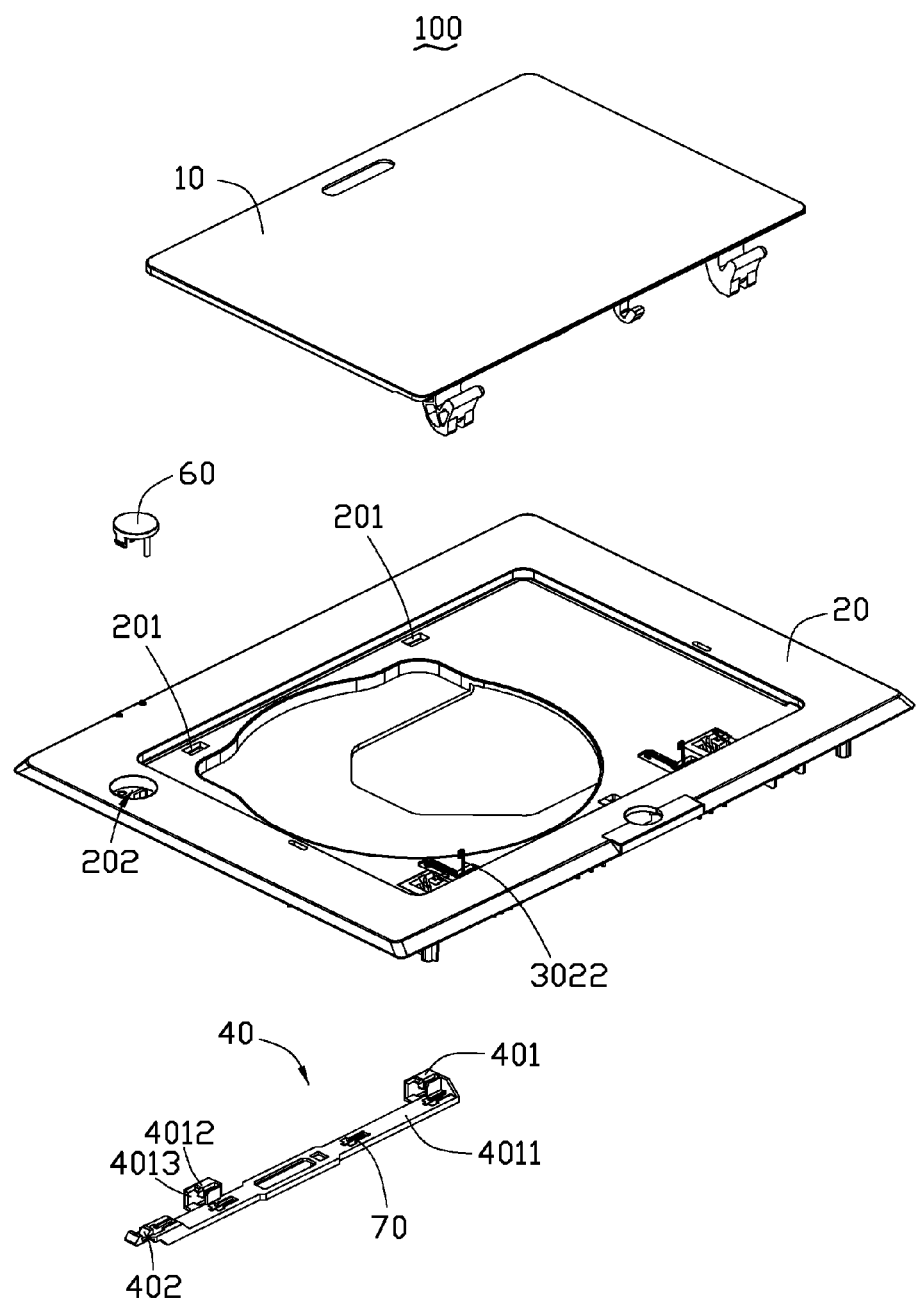
FIG. 2 is an isometric, exploded view of the electronic device of FIG. 1.

Referring to FIGS. 1 and 2, a foldable electronic device 100 of the embodiment is shown. The foldable electronic device 100 includes a cover 10, a main body 20, a connection mechanism 30, and a slidable member 40. The connection member 30 rotatably connects the cover 10 to the main body 20. In the embodiment, the connection member 30 includes a pivot portion 301 and a resilient member 302. The pivot portion 301 is integrally formed with the cover 10, and engages a corresponding hole (not shown) of the main body 20, which rotatably connects the cover 10 to the main body 20. In an alternative embodiment, the pivot portion 301 may be formed on the main body or may be a separate, independent element.

The resilient member 302 includes a coil 3021 and two arms 3022. The coil 3021 is received in an opening (not labeled) of the main body 20, and the two arms 3022 abut against the cover 10 and the main body 20. When the cover 10 is closed, the resilient member 302 is twisted and applies a push force to the cover 10. When the cover 10 is freed from a limitation that retains the cover 10 in the closed position, the resilient member 302 pushes the cover 10 to an open position as shown in FIG. 1.

The cover 10 includes two hooks 101 protruding from an inner surface facing the main body 20. The slidable member 40 is slidably connected to the main body 20 at an inner side.

In the embodiment, the slidable member 40 includes two hook receivers 401 respectively corresponding to the two hooks 101. The main body 20 defines two through holes 201 that allow the two hooks 101 to pass therethrough to engage with the hook receivers 401 when the cover 10 is closed.

Figure 3:
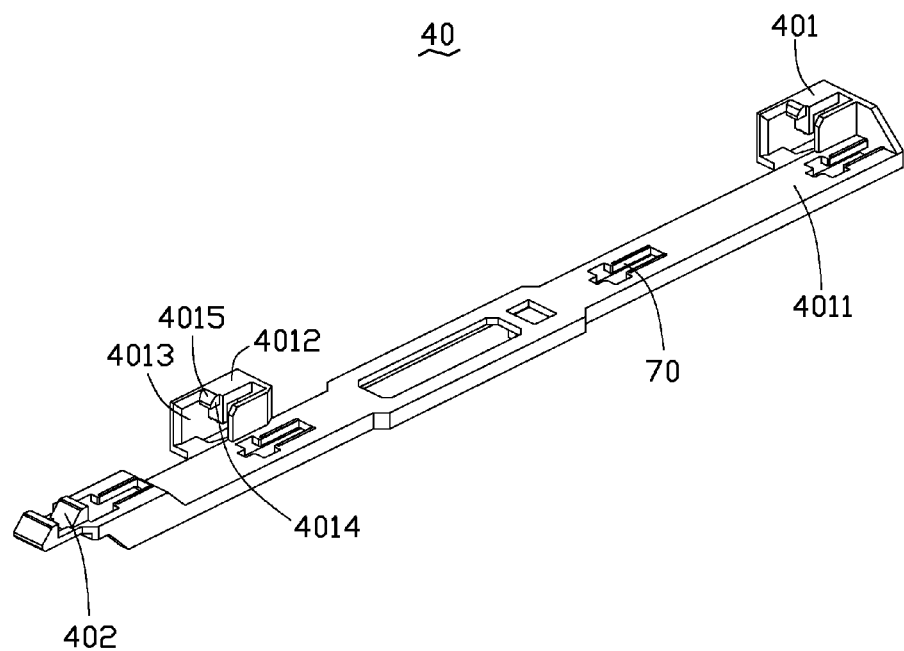
FIG. 3 is an enlarged view of portion III of FIG. 2.

Referring to FIG. 3, each hook receiver 401 of the embodiment is shown. Each hook receiver 401 includes an elongated body 4011, and a wall 4013 protruding from the elongated body 4011. A top portion 4012 protrudes laterally from one side of the wall 4013. An engaging projection 4014 projects from one end of the top portion 4012. The engaging projection 4014 includes an inclined surface 4015 joining the top surface of the top portion 4012. Each hook receiver 401 is located under the corresponding through hole 201 of the main body 20. A spring 70 (FIG. 5) with two ends fixed to the main body 20 and the slidable member 40 is used to apply a push force to retain the slidable member 40 at its normal position.

During the closing of the cover 10, each hook 101 will pass through the corresponding through hole 201 first, and then moves downward and contacts the inclined surface 4015 of the corresponding hook receiver 401. The hook 101 then pushes the slidable member 40 to move until the hook 101 moves to the end of the inclined surface 4015. The spring 70 then urges the slidable member 40 to move back to the normal position where the hooks 201 engage with the corresponding engaging projections 4014, thereby retaining the cover 10 at the closed position.

Figure 4:
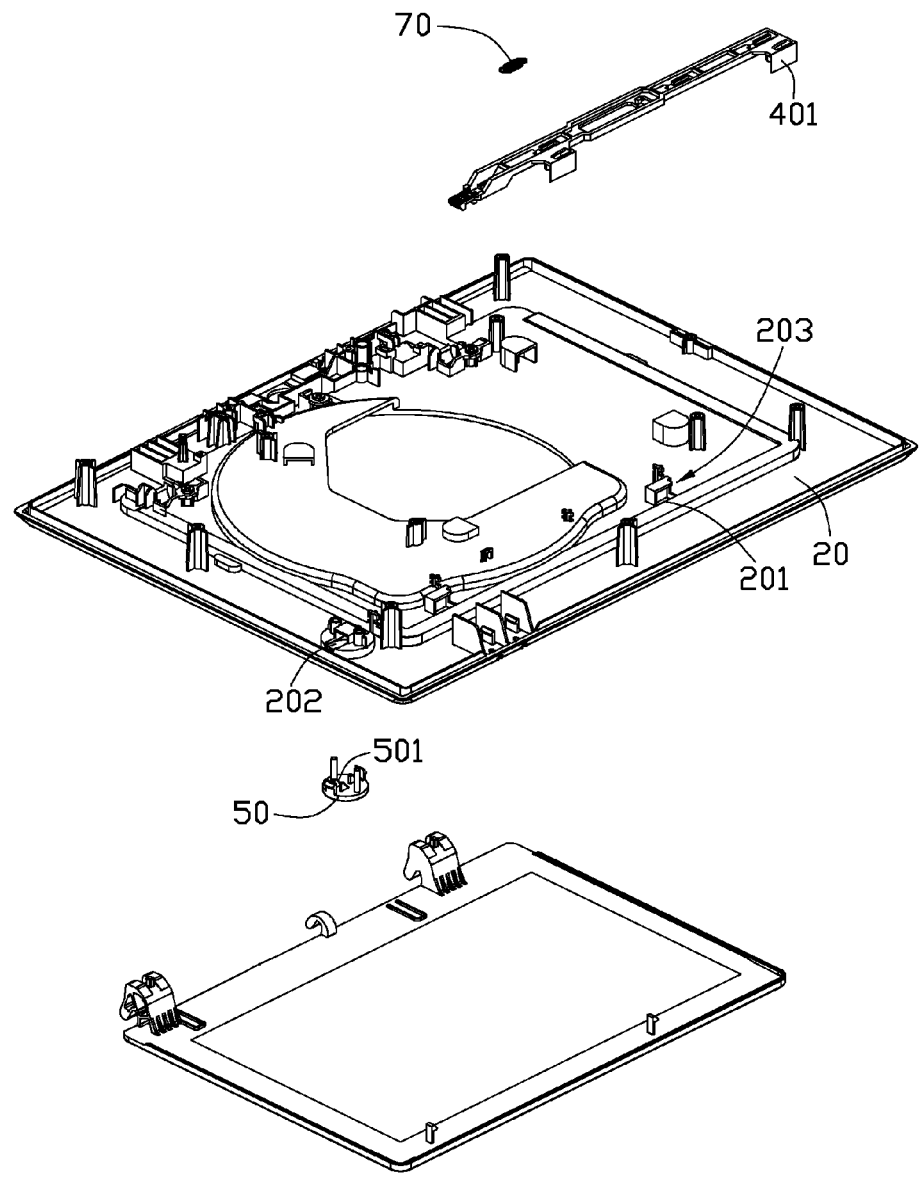
FIG. 4 is similar to FIG. 2, but viewed from another viewpoint.
Figure 5:
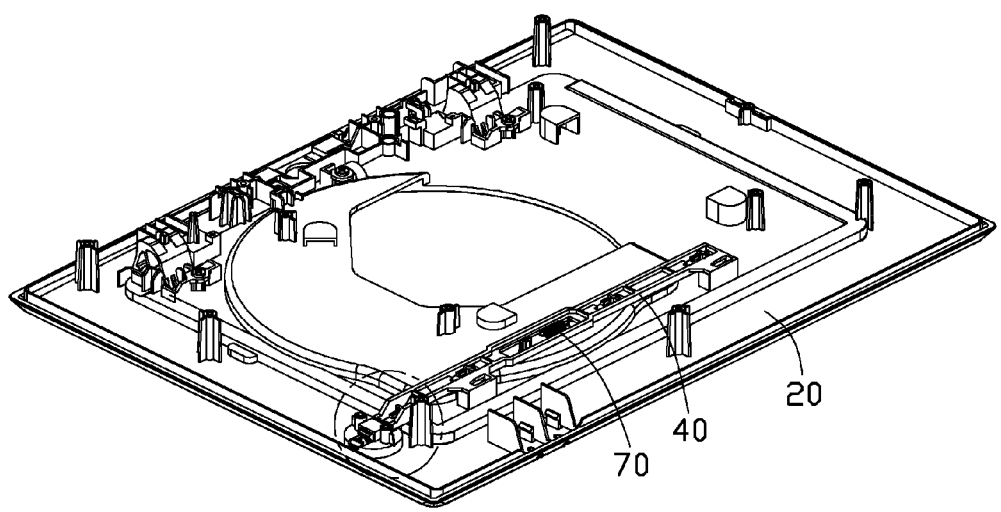
FIG. 5 is an isometric view of the foldable electronic device when the cover is closed, with certain elements omitted for clarity.
Figure 6:
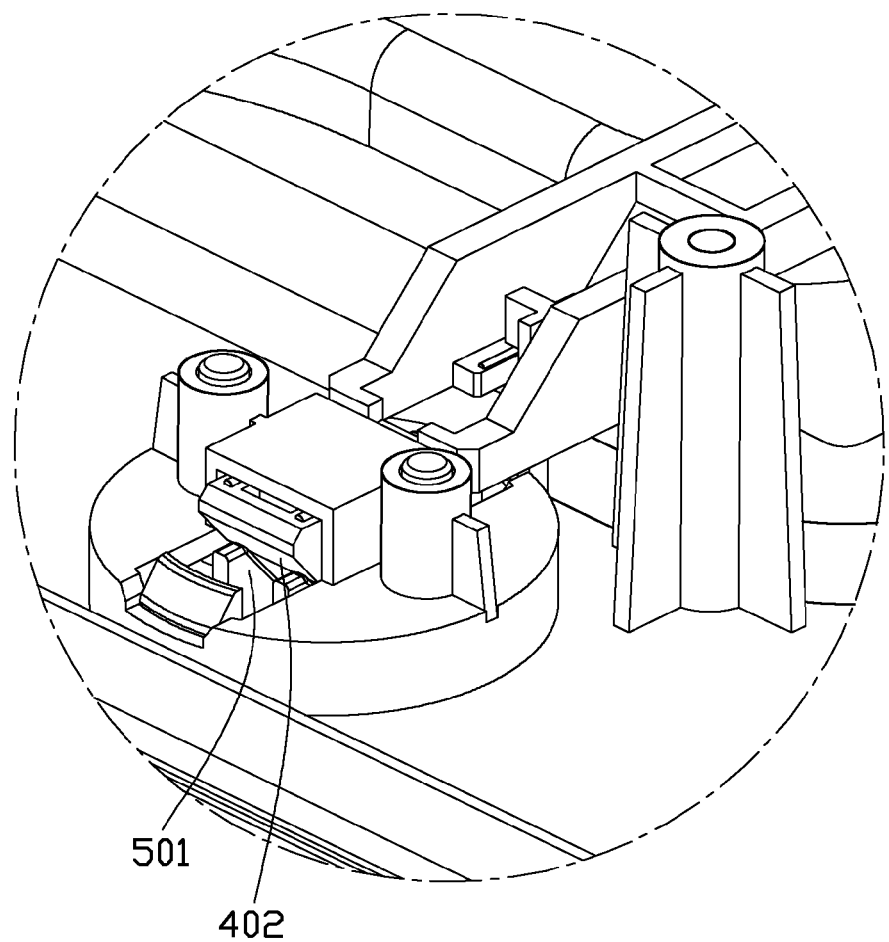
FIG. 6 is an enlarged view of portion VI of FIG. 5.

Referring to FIG. 4, in the embodiment, the main body 20 further includes a shield 203 protruding from the inner surface of the main body 20. As shown in FIG. 5, the shield 203 cooperates with the wall 4013 of the hook receiver 401 to prevent dust from entering into the main body 20 via the through hole 201.

The electronic device 100 further includes a button 50 depressibly mounted in a cavity 202 defined in the main body 20. The button 50 includes a protruding tab 501 protruding from its inner side. The protruding tab 501 includes a wedged end. The slidable member 40 includes a wedged portion 402. As shown in FIG. 5, when the cover 10 is closed, the wedged end of the protruding tab 501 contacts the wedged portion 402. When the button 50 is pressed, the protruding tab 501 pushes the wedged portion 402, which causes the slidable member 40 to move. When the slidable member 40 moves to a position where the hooks 101 disengage from the engaging projections 4014 of the hook receiver 401, the resilient member 302 pushes the cover 10 to the open position as shown in FIG. 1.

While various embodiments have been described and illustrated, the disclosure is not to be construed as being limited thereto. Various modifications can be made to the embodiments by those skilled in the art without departing from the true spirit and scope of the present disclosure as defined by the appended claims.

What is claimed is:

1. A foldable electronic device comprising:
a main body defining a through hole;
a cover rotatably connected to the main body, the cover comprising a hook passable through the through hole;
a slidable member slidably connected to the main body, the slidable member comprising a hook receiver and a wedged portion, the hook receiver comprising an engaging projection, the engaging projection being configured for engaging with the hook, thereby locking the cover on the main body; and
a button depressibly mounted on the main body, the button comprising a protruding tab configured to push the wedged portion, when the button is depressed, to cause the slidable member to move along a direction substantially perpendicular to the depressing direction of the button, thereby disengaging the hook from the engaging projection;

wherein the hook receiver comprises a wall and a top portion protruding laterally from one side of the wall, the engaging projection protrudes from one end of the top portion, the main body comprises a shield adjacent to the through hole, the shield cooperates with the wall to shield the through hole, thereby preventing dust from entering into the main body via the through hole.

2. The foldable electronic device according to claim 1, wherein the protruding tab comprises a wedged end, the wedged end contacts the wedged portion when the button is depressed.

3. The foldable electronic device according to claim 1, further comprising a spring connected to the main body and the slidable member to apply a push force to the slidable member.

4. The foldable electronic device according to claim 3, wherein the engaging projection comprises an inclined surface obliquely oriented relative to the moving direction of the slidable member, when the cover is being closed, the hook moves toward and slides on the inclined surface which enables the hook to push the slidable member to move away from a normal position in a direction opposite to the push force direction, until the hook moves off the inclined surface, the slidable member is moved back to the normal position due to the push force, and the hook engages with the engaging projection.

5. The foldable electronic device according to claim 1, further comprising a resilient member, wherein the resilient member comprises two arms abutting against the main body and the cover, when the hook disengages from the engaging projection, the resilient member pushes the cover to rotate away from the main body.

\* \* \* \* \*